United States Patent
Shieh et al.

(10) Patent No.: US 9,153,483 B2
(45) Date of Patent: Oct. 6, 2015

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Ming-Feng Shieh, Yongkang (TW); Wen-Hung Tseng, Luodong Township (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/066,889

(22) Filed: Oct. 30, 2013

(65) Prior Publication Data

US 2015/0118837 A1   Apr. 30, 2015

(51) Int. Cl.
| H01L 21/3205 | (2006.01) |
| --- | --- |
| H01L 21/4763 | (2006.01) |
| H01L 21/768 | (2006.01) |
| H01L 29/423 | (2006.01) |
| H01L 29/417 | (2006.01) |
| H01L 21/28 | (2006.01) |

(52) U.S. Cl.
CPC .... *H01L 21/76879* (2013.01); *H01L 29/41725* (2013.01); *H01L 29/4232* (2013.01); *H01L 21/28* (2013.01); *H01L 21/3205* (2013.01); *H01L 21/4763* (2013.01)

(58) Field of Classification Search
CPC .................. H01L 2924/0002; H01L 2924/00; H01L 21/823814; H01L 21/823842; H01L 21/823871; H01L 21/82345; H01L 21/76897; H01L 21/76843; H01L 21/76834; H01L 21/823425; H01L 21/82385; H01L 21/28; H01L 21/76805; H01L 21/76847; H01L 21/76865; H01L 21/76885; H01L 21/823828; H01L 29/66795; H01L 29/785; H01L 29/7834; H01L 29/401; H01L 21/76808; H01L 21/76895; H01L 21/76802; H01L 21/823475; H01L 21/76831; H01L 21/76877; H01L 21/76879; H01L 29/66545; H01L 29/41725; H01L 29/4232; H01L 27/10894; H01L 23/485
See application file for complete search history.

(56) References Cited

U.S. PATENT DOCUMENTS

| 6,797,611 | B1 * | 9/2004 | Wu et al. ........................ 438/637 |
| --- | --- | --- | --- |
| 8,536,040 | B1 * | 9/2013 | Park .............................. 438/592 |
| 8,679,909 | B2 * | 3/2014 | Xie et al. ....................... 438/183 |
| 8,836,129 | B1 * | 9/2014 | Hung et al. .................... 257/760 |
| 8,962,464 | B1 * | 2/2015 | Chang et al. .................. 438/588 |
| 2002/0025669 | A1 * | 2/2002 | Hwang et al. ................. 438/637 |
| 2004/0241917 | A1 * | 12/2004 | Schwan et al. ................ 438/151 |
| 2005/0142756 | A1 * | 6/2005 | Park et al. ..................... 438/258 |

(Continued)

*Primary Examiner* — Brett Feeney
*Assistant Examiner* — Sophia Nguyen
(74) *Attorney, Agent, or Firm* — Haynes and Boone, LLP

(57) ABSTRACT

A method of fabricating a semiconductor integrated circuit (IC) is disclosed. A first conductive feature and a second conductive feature are provided. A first hard mask (HM) is formed on the first conductive feature. A patterned dielectric layer is formed over the first and the second conductive features, with first openings to expose the second conductive features. A first metal plug is formed in the first opening to contact the second conductive features. A second HM is formed on the first metal plugs and another patterned dielectric layer is formed over the substrate, with second openings to expose a subset of the first metal plugs and the first conductive features. A second metal plug is formed in the second openings.

20 Claims, 9 Drawing Sheets

(56) References Cited

U.S. PATENT DOCUMENTS

| | | | |
|---|---|---|---|
| 2006/0263985 A1* | 11/2006 | Kang et al. | 438/275 |
| 2006/0266448 A1* | 11/2006 | Arai et al. | 148/593 |
| 2009/0230479 A1* | 9/2009 | Hsu et al. | 257/369 |
| 2010/0055857 A1* | 3/2010 | Lin et al. | 438/270 |
| 2011/0062502 A1* | 3/2011 | Yin et al. | 257/288 |
| 2011/0156162 A1* | 6/2011 | Richter et al. | 257/379 |
| 2011/0156166 A1* | 6/2011 | Huang et al. | 257/392 |
| 2012/0043614 A1* | 2/2012 | Choi et al. | 257/369 |
| 2012/0098070 A1* | 4/2012 | Wang | 257/368 |
| 2012/0119306 A1* | 5/2012 | Ho et al. | 257/401 |
| 2012/0196432 A1* | 8/2012 | Yan | 438/586 |
| 2012/0225534 A1* | 9/2012 | Lee et al. | 438/382 |
| 2013/0043516 A1* | 2/2013 | Han et al. | 257/288 |
| 2014/0284671 A1* | 9/2014 | Hung et al. | 257/296 |

* cited by examiner

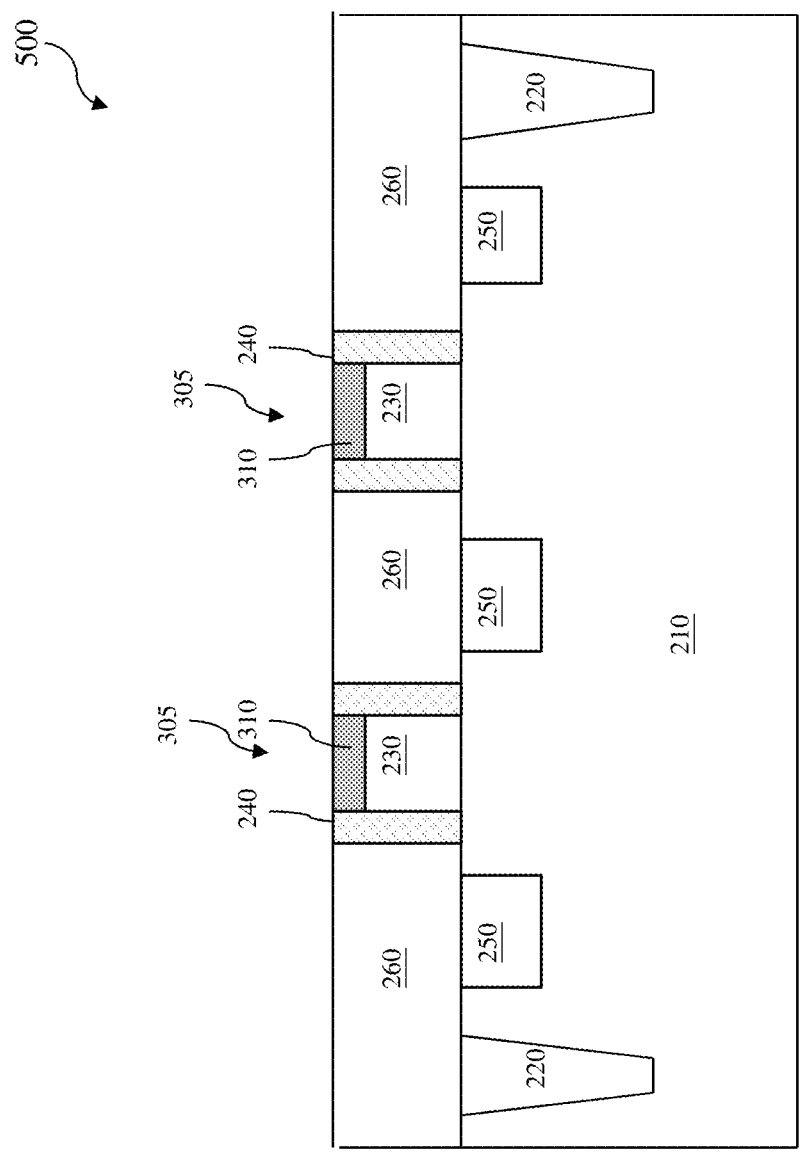

METHOD OF SEMICONDUCTOR INTEGRATED CIRCUIT FABRICATION

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more robust metal plug formation for interconnection structures. It is desired to have improvements in this area

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
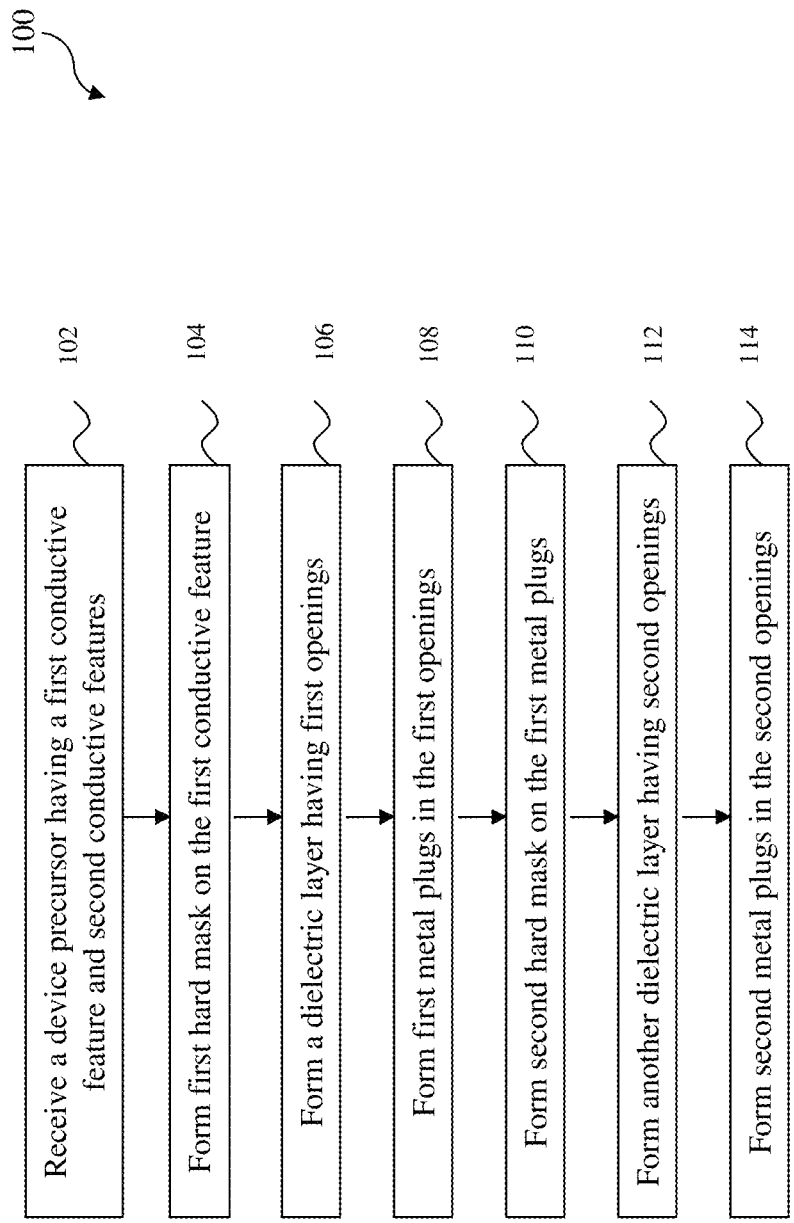
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIG. 2 and a semiconductor device 500 shown in FIGS. 3A-3B, 4 to 8 for the sake of example. It is understood that additional steps can be provided before, during, and after the method, and some of the steps described can be replaced or eliminated for other embodiments of the method.

Figure 2:
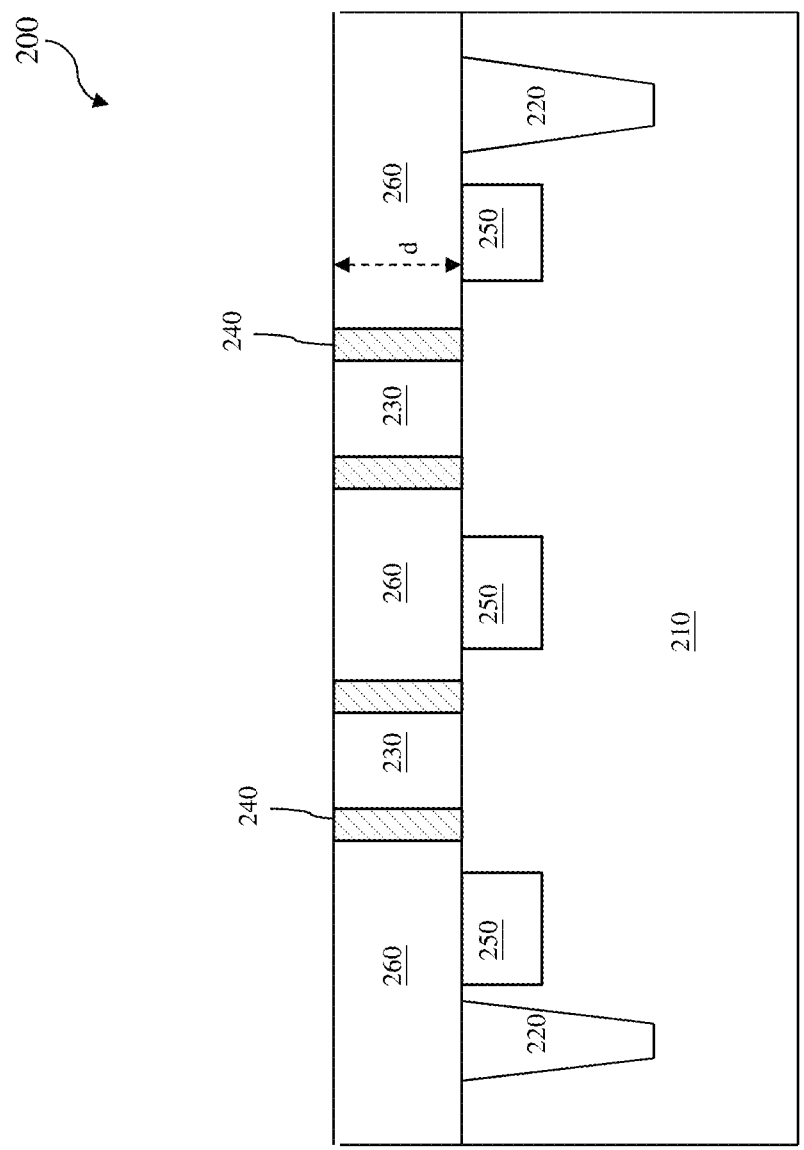
FIGS. 2 to 8 are cross-sectional views of an example semiconductor integrated circuit (IC) at fabrication stages constructed according to the method of FIG. 1.

Referring to FIGS. 1 and 2, the method 100 begins at step 102 by receiving a semiconductor device precursor 200. The semiconductor device precursor 200 includes a substrate 210. In the present embodiment, the substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor device precursor 200 also includes one or more first conductive features 230. In one embodiment, the first conductive feature 230 may include high-k/metal gates (HK/MGs), a three-dimension HK/MGs wrapping over a fin-like structure. As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. Additionally, sidewall spacers 240 are formed on the sidewalls of the HK/MGs. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by deposition and dry etching processes known in the art.

In another embodiment, the first conductive features 230 include electrodes, capacitors, resistors or a portion of a resistor. In yet another embodiment, the first conductive features 230 include a portion of the interconnect structure. For example, the first conductive features 230 include contacts, metal vias, or metal lines.

The semiconductor device precursor 200 also includes second conductive features 250 in the substrate 210. A top surface to the second conductive feature 250 may not be at a same horizontal level as a top surface of the first conductive feature 230. In one embodiment, the top surface of the second conductive features 250 are horizontally below the top surface of the first conductive features 230 with a depth d, as shown in FIG. 2. In one embodiment, the second conductive features 250 include doped regions (such as sources or drains), or gate electrodes. In another embodiment, the second conductive features 250 include electrodes, capacitors, resistors or a portion of a resistor, or a portion of the interconnect structure.

The semiconductor device precursor 200 also includes a first dielectric layer 260 deposited over the substrate 210, including between/over each of the first conductive features 230 and over the second conductive features 250. The first dielectric layer 260 includes silicon oxide, silicon nitride, oxynitride, a dielectric material having a dielectric constant (k) lower than thermal silicon oxide (therefore referred to as low-k dielectric material layer), or other suitable dielectric material layer. The first dielectric layer 260 includes a single layer or multiple layers. A CMP may be performed to remove excessive the first dielectric layer 260 to expose the top surface of the first conductive features 230, as well as to provide a substantially planar top surface for the first conductive features 230 and the first dielectric layer 260.

Figure 3A:
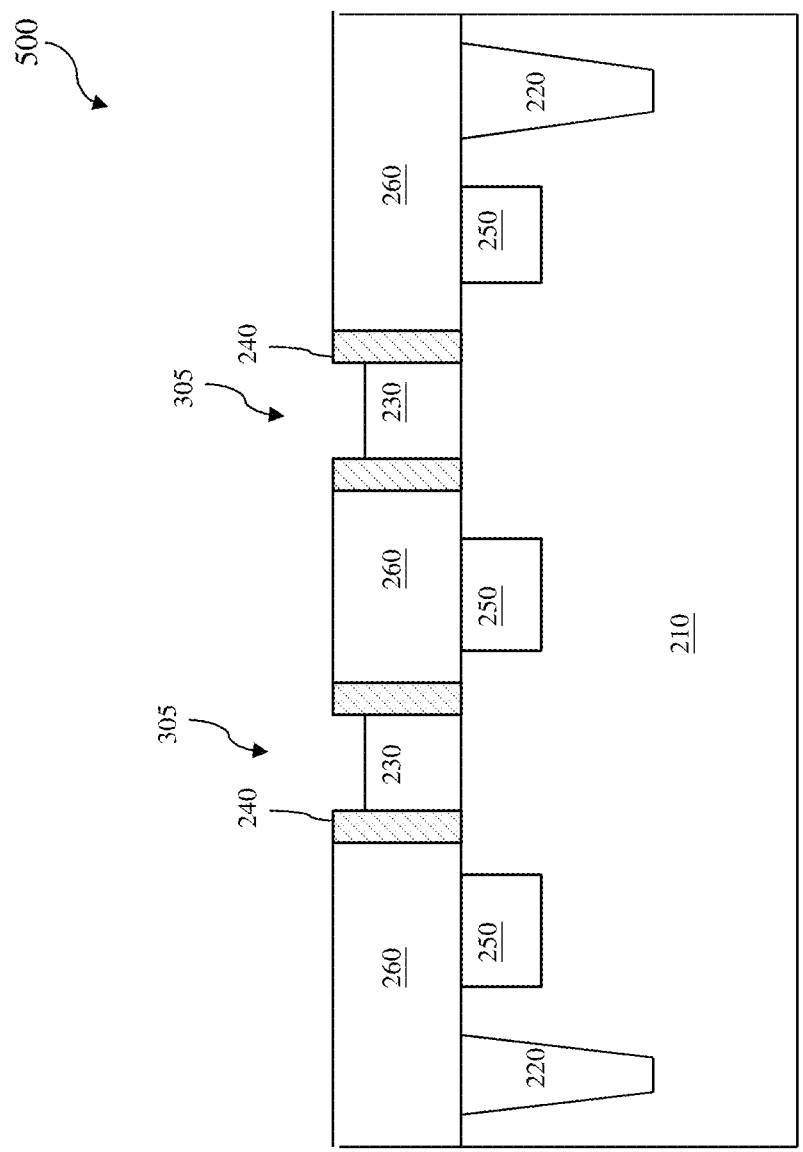

Referring FIGS. 1 and 3A-3B, once the semiconductor device precursor 200 is received, the method 100 proceeds to step 104 by forming a first hard mask (HM) layer 310 on the first conductive features 230. In one embodiment, the first conductive features 230 are recessed first by a selective etch to form first trenches 305, as shown in FIG. 3A. The selective etch may include a wet etch, a dry etch, or a combination thereof. In another embodiment, the first trenches 305 are formed by proper processes including patterning and etching. The first trenches 305 are then filled in by the first HM layer 310 by suitable techniques, such as chemical vapor deposition (CVD), or physical vapor deposition (PVD). The first HM layer 310 includes titanium oxide, tantalum oxide, silicon nitride, silicon oxide, silicon carbide, and silicon carbide nitride. In the present embodiments, the HM layer 310 is different from the first dielectric layer 260 to achieve etching selectivity during a subsequent etch, which will be described later. In one embodiment, a CMP process is then performed to remove excessive the first HM layer 310. The CMP process is controlled such that the first HM layer 310 above the first trenches 305 are removed, thus the portion of the first HM layer 310 in the first trenches 305 become a top layers of the first conductive features 230, as shown in FIG. 3B.

Figure 4:
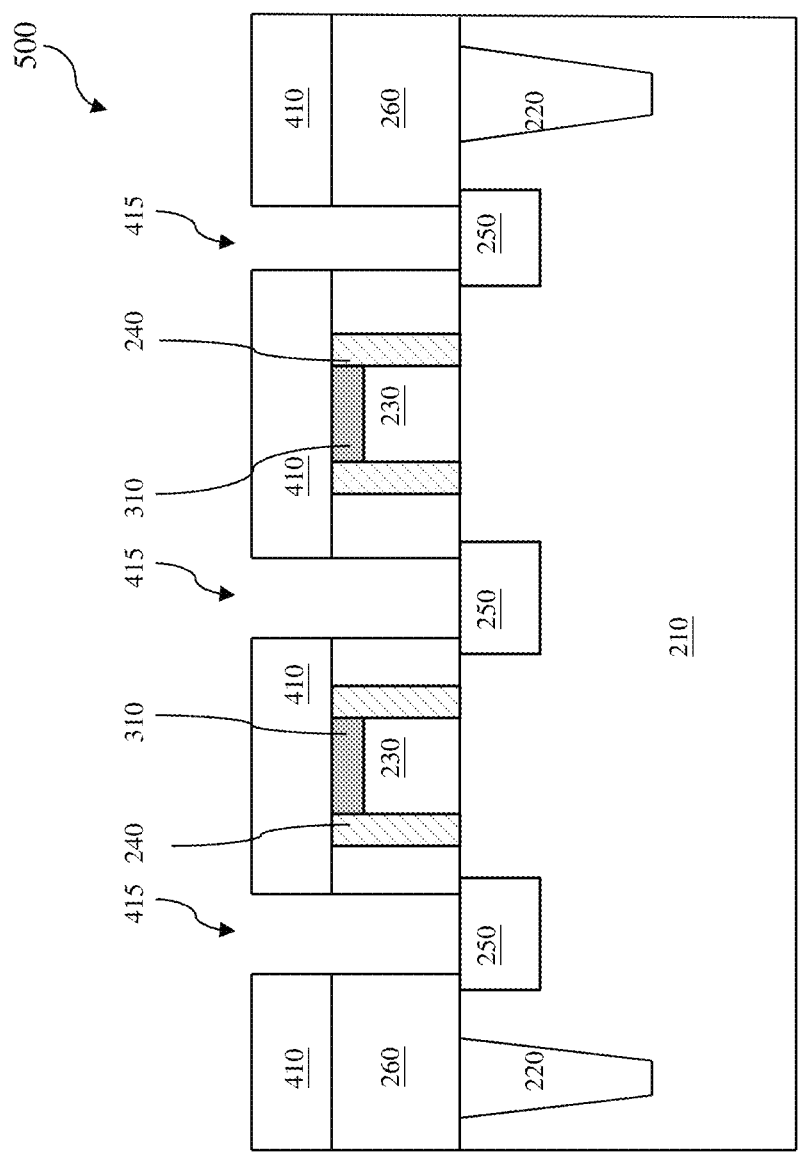

Referring FIGS. 1 and 4, the method 100 proceeds to step 106 by forming a second dielectric layer 410, with first openings 415, over the substrate 210. The second dielectric layer 410 is similar in many respects to the first dielectric layer 260 discussed above in association with FIG. 2. At the bottom of the first openings 415, a portion of the second conductive features 250 are exposed. The first openings 415 may be formed by lithography patterning and etching processes. In present embodiment, the first openings 415 are formed aligning to the respective second conductive features 250 and not aligning to the first conductive features 230, as shown in FIG. 4. With a substantial same depth of the first openings 415, an etching process window may be improved. In one embodiment, the first openings 415 are formed by an etch process that selectively removes the second dielectric layer 410 and the first dielectric layer 260 but substantially does not etch the sidewall spacers 240 and the first HMs 310. Thus, with protection of the sidewall spacers 240 and the first HMs 310, constrains of overlay in first opening patterning process is relaxed and etching process window is improved as well.

Figure 5:
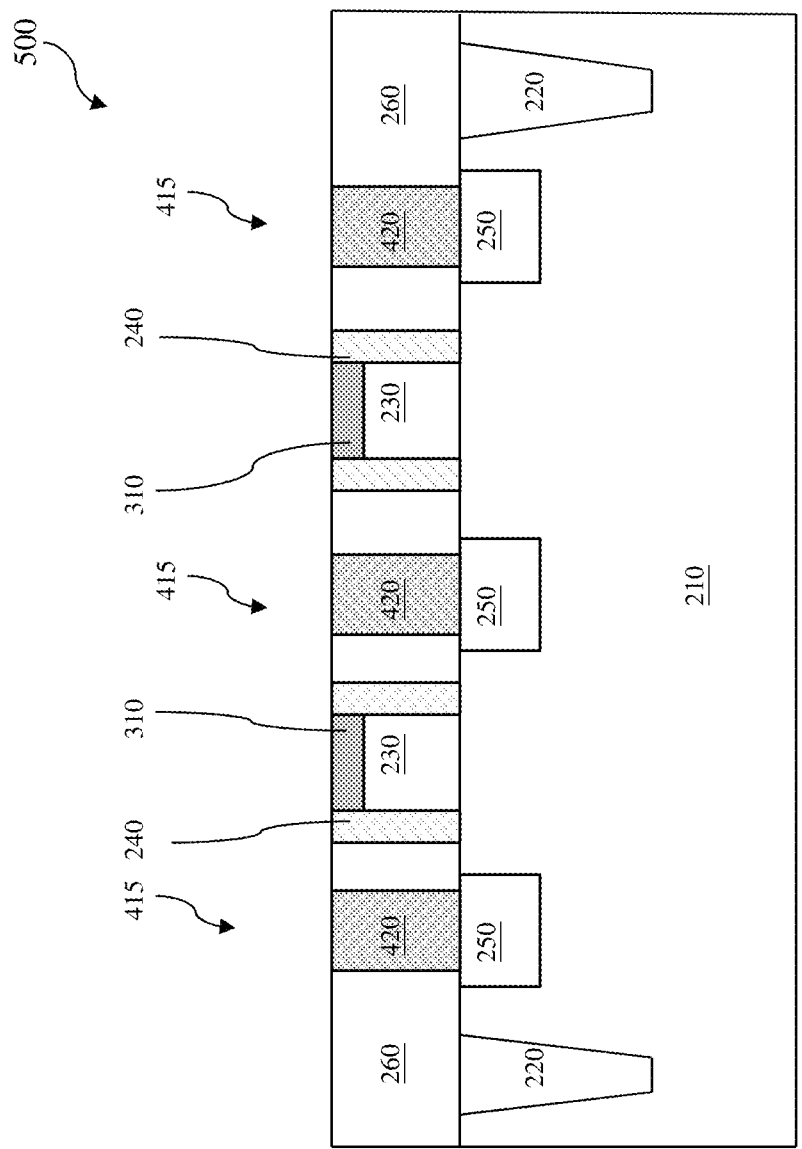

Referring to FIGS. 1 and 5, the method 100 proceeds to step 108 by forming first metal plugs 420 in the first openings 415 to form full contacts extending down to the second conductive features 250. In one embodiment, a first barrier layer is formed in the first openings 415 first by a proper deposition technique, such as PVD and CVD. The first barrier layer may include a metal and is electrically conductive but does not permit inter-diffusion and reactions between the first dielectric material layer 260 and a first metal layer 420 to be filled in the first openings 415. The first barrier layer may include refractory metals and their nitrides. In various examples, the first barrier layer includes TiN, TaN, Co, WN, TiSiN, TaSiN, or combinations thereof. The first barrier layer may include multiple films.

The first metal layer 420 then fills in the first openings 415, as well as over the first barrier layer. The first metal layer 420 may include copper (Cu), aluminum (Al), tungsten (W), copper or copper alloy, such as copper magnesium (CuMn), copper aluminum (CuAl) or copper silicon (CuSi), or other suitable conductive material. The first metal layer 420 may be deposited by y PVD, CVD, metal-organic chemical vapor deposition (MOCVD), or plating.

In the present embodiment, after the first openings 415 are filled by the first metal layer 420, a recess is performed to etch back the excessive first metal layer 420, as well as the excessive first barrier layer, and the second dielectric layer 410 and provide a substantially planar surface. The recess is controlled that it etches back until the top surface of the first HMs 310 are exposed. As an example, a CMP is performed to polish back the excessive first metal layer 420, as well as the excessive first barrier layer, and the second dielectric layer 410. Thus a portion of the first metal layer 420, which fills in the first openings 415, forms the first metal plugs 420. By filling in the first openings 415 first and then recessing back, the first metal plugs 420 are formed with a self-alignment nature. Also combining with the sidewall spacers 240, the first HMs 310 provide an electrical isolation to prevent electrical short between the first metal plugs 425 and the first conductive features 230.

Figure 6:
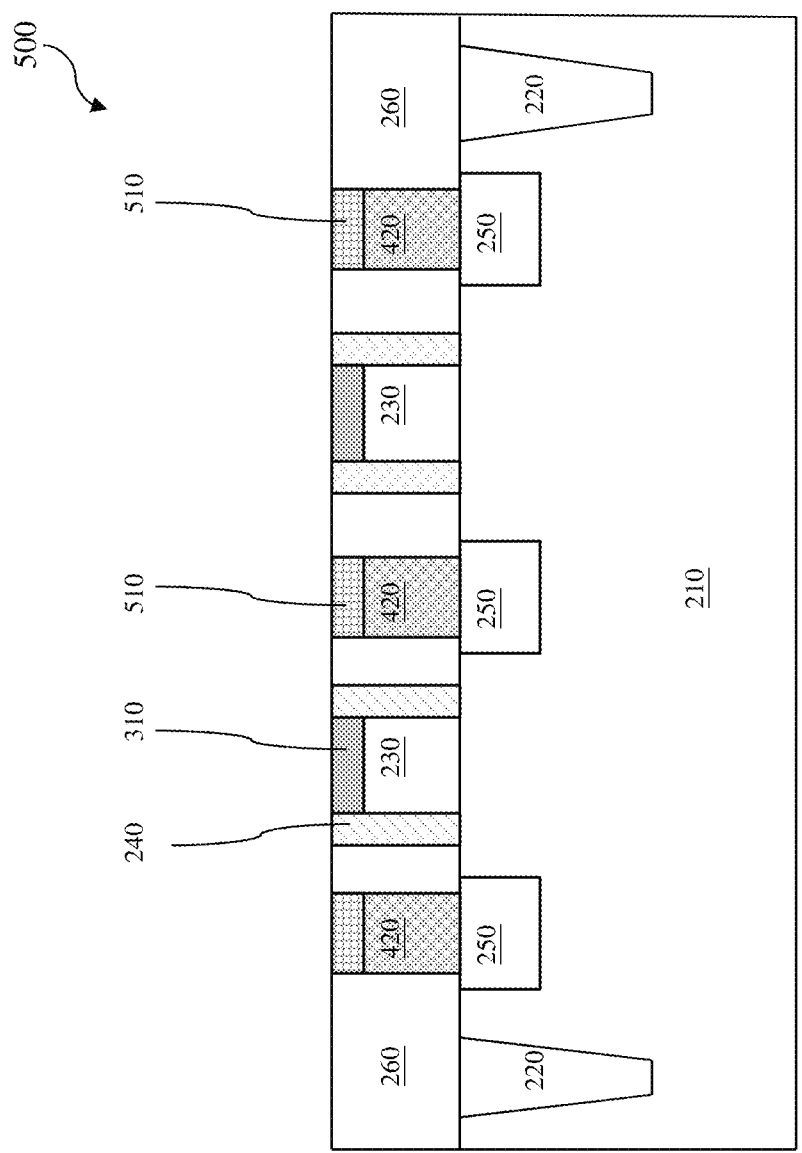

Referring to FIGS. 1 and 6, the method 100 proceeds to step 110 by forming second HMs 510 on the first metal plugs 425. The second HMs 510 are formed similarly in many respects to the first HMs 310 discussed above in association with FIGS. 3A and 3B. The second HM layer 510 includes titanium oxide, tantalum oxide, silicon nitride, silicon oxide, silicon carbide, and silicon carbide nitride. In one embodiment, the first metal plugs 420 are recessed first by a selective etch to form second trenches. The second trenches are then filled in by the second HM layer 510 and a recess process is then performed to remove excessive the HM layer 510. Therefore the portion of the second HM layer 510 filled in the second trenches become top layers of the first metal plugs 420. In the present embodiment, the recess is controlled that it etches back the second HM layer 510 until the top surface of the first HMs 310 are exposed. Thus, as top layers on the first conductive features 230 and the first metal plugs 420, respectively, the firsts HM 310 and the second HMs 510 provide isolation layers to prevent electric short between them and a to-be-formed second metal plug, which will be described later.

Figure 7:
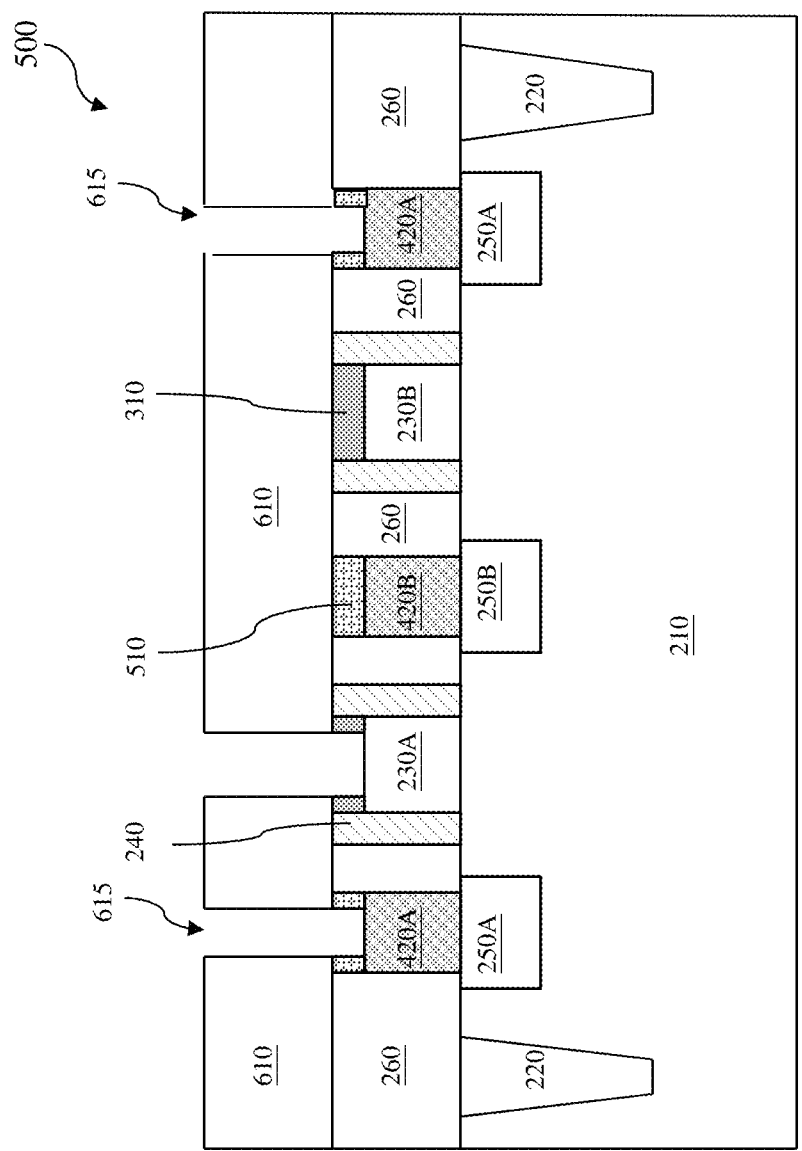

Referring to FIGS. 1 and 7, the method 100 proceeds to step 112 by forming the third dielectric layer 610, with second openings 615, over the substrate 210, including over the first conductive features 230 and the first metal plugs 420. The third dielectric layer 610 and the second openings 615 are formed similarly in many respects to the second dielectric layer 410 and the first openings 415 discussed above in association with FIG. 4. The second openings 615 are formed to expose a subset of the first conductive features 230 and the first metal plugs 420 (which connecting with the second conductive feature 250). For the sake of clarity to better describing the method 100, now labeling the subset of the first conductive features 230, the first metal plugs 420 and the second conductive features 250 with the reference number 230A, 420A and 250A, respectively, and labeling rest of the first conductive features 230, the first metal plugs 420 and the second conductive feature 250 with the reference number 230B, 420B and 250B, respectively. In one embodiment, the second openings 615 are formed by lithography patterning and etching processes. The first HM 310 on the first conductive feature 230A and the second HM 510 on the first metal plug 420A are moved during the etch process as well. With a substantial same depth of the second opening 615, an etching process window is improved.

Figure 8:
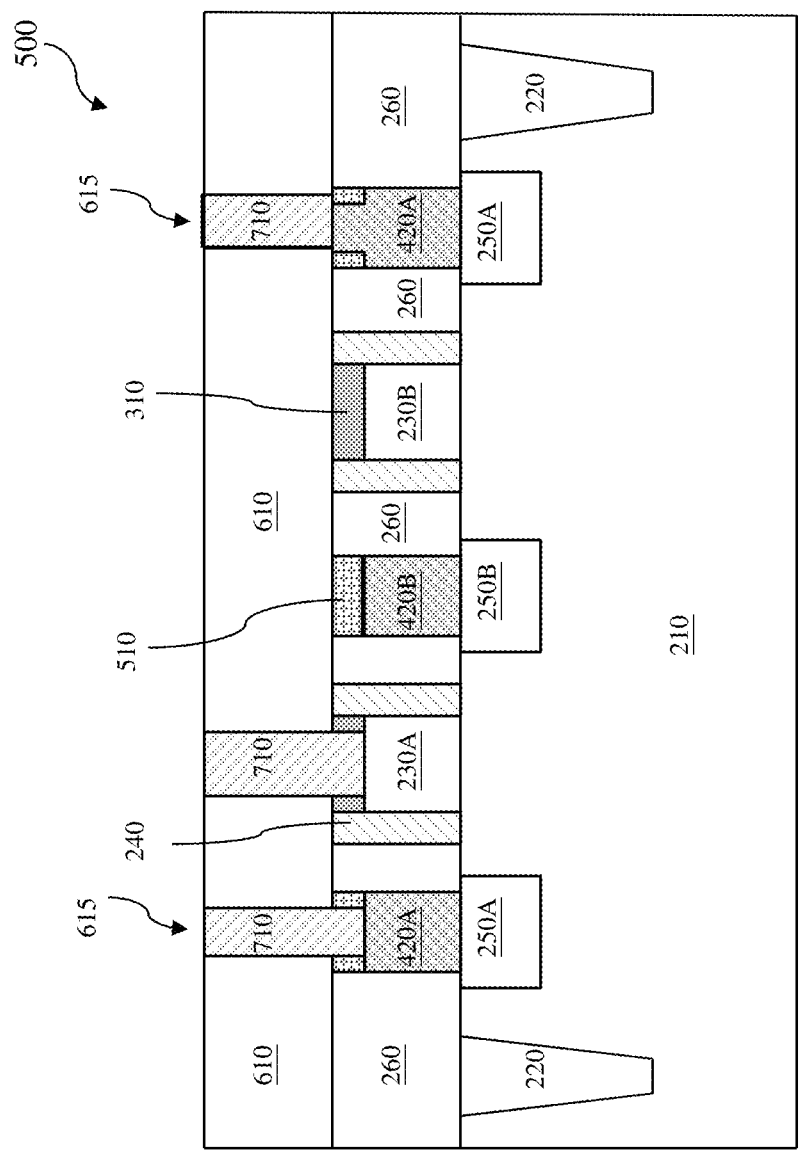

Referring to FIGS. 1 and 8, the method 100 proceeds to step 114 by forming a second metal plugs 710 in the second openings 615 to form a full contact extending down to the first conductive features 230A and the first metal plugs 420A. Thus, the second metal plugs 710 are formed similarly in many respects to the first metal plug 420 discussed above in association with FIG. 5. In one embodiment, a second barrier layer is formed in the second openings 615 first. The second barrier layer may include refractory metals and their nitrides. In various examples, the second barrier layer includes TiN, TaN, Co, WN, TiSiN, TaSiN, or combinations thereof. The second barrier layer may include multiple films.

The second metal layer 710 then fills in the second openings 615, including depositing over the second barrier layer. The second metal layer 710 may include copper (Cu), aluminum (Al), tungsten (W), copper or copper alloy, such as copper magnesium (CuMn), copper aluminum (CuAl) or copper silicon (CuSi), or other suitable conductive material. A recess is then performed to etch back the excessive second metal layer 710, as well as the excessive second barrier layer, to form the second metal plugs 710 and a substantial planar surface with the third dielectric layer 610.

By filling in the second openings 615 first and then recessing back, the second metal plugs 710 are formed with a self-alignment nature. During the forming of the second metal plugs 710, the first HMs 310 and the second HMs 510 enhance protection between the first conductive features 230B and the first metal plugs 420B to the second metal plugs 710, which relaxes process constrains and improves process window.

In the present embodiment, a vertical conductive connection for the second conductive feature 250A, is provided by two metal plugs on top of each other, the second metal plug 710 on top of the first metal plug 420A, instead of one metal plug. Usually during forming an opening, the opening becomes narrower as it extends deeper. Thus, to achieve a targeted bottom size of an opening, a deeper opening usually need a wider opening at its top. Therefore a spacing separating two adjacent openings may become smaller. A smaller separating spacing may make process window be narrower, such as a smaller tolerance for misalignment. It may also lead more constrains in reducing device packing density. Thus, instead of one deeper opening, in this two plug scheme, each opening forms as a portion of the deeper opening and therefore a smaller top width (comparing with a deeper opening) may be achieved.

Additional steps can be provided before, during, and after the method 100, and some of the steps described can be replaced, eliminated, or moved around for additional embodiments of the method 100. For example, prior to depositing the second dielectric layer 410 (in step 106), an etch stop layer is deposited over the substrate to enhance etch process control in recessing the first metal layer 420 (in step 108). The device 500 may undergo further CMOS or MOS technology processing to form various features and regions.

Based on the above, the present disclosure offers a method for fabricating a semiconductor device. The method employs forming a hard mask as a top layer of a conductive feature to protect the respective conductive feature during a formation of a metal plug to connect another conductive feature. The method also employs forming a metal plug with a self-alignment nature. The method demonstrates an integration of interconnection with a relaxed process constrains, enhanced electrical short protection and improved process window.

The present disclosure provides many different embodiments of fabricating a semiconductor IC that provide one or more improvements over existing approaches. In one embodiment, a method for fabricating a semiconductor integrated circuit (IC) includes providing a first conductive feature and a second conductive feature in a substrate. The first and the second conductive features are separated by a first dielectric layer. A top surface of the second conductive feature is below a top surface of the first conductive feature, horizontally. The method also includes forming a first hard mask (HM) as a top layer on the first conductive feature, depositing a second dielectric layer over the first and the second conductive features, forming the first openings in the first and the second dielectric layers to expose the second conductive features, forming a first metal plug in the first openings to contact the second conductive features, forming a second HM as a top layer on the first metal plugs, depositing a third dielectric layer over the first conductive feature and the first metal plugs, forming second openings in the third dielectric layer to expose a subset of the first conductive features and the first metal plugs and forming second metal plugs in the second openings to connect to the subset of first conductive features and the first metal plugs.

In another embodiment, a method for fabricating a semiconductor IC includes providing a device precursor. The device precursor includes high-k/metal gates (HK/MGs) in a substrate, sidewall spacers along HK/MG sidewalls, conductive features in the substrate and a first dielectric layer to separate the HK/MGs and the second conductive features. A top surface of the conductive feature is below a top surface of the HK/MGs, horizontally. The method also includes recessing the HK/MGs to form first trenches on the HK/MGs, forming first hard masks (HM) in the first trenches, therefore the first HMs are top layers on the HK/MGs. The method also includes depositing a second dielectric layer over the HK/MGs and the conductive features, forming first openings in the second and the first dielectric layers to expose the conductive features, filling in the first openings with a first metal layer to contact the conductive features, recessing the first metal layer and the second dielectric layer until the first HMs are exposed. Therefore first metal plugs are formed in the first openings. The method also includes forming a second HM as a top layer on the first metal plugs, depositing a third dielectric layer over the HK/MGs and the first metal plugs, forming second openings in the third dielectric layer to expose a subset of the HK/MGs and the first metal plugs and forming second metal plugs in the second openings to connect with the subset of HK/MGs and the first metal plugs.

In yet another embodiment, a method for fabricating a semiconductor IC includes providing a first conductive feature and a second conductive feature in a substrate, separated by a first dielectric layer. The method also includes forming a first hard mask (HM) as a top layer on the first conductive feature, forming a first patterned dielectric layer over the first and the second conductive features. Therefore the first patterned dielectric layer having openings to expose the second conductive features. The method also includes forming a first metal plug in the first openings to connect the second conductive features, forming a second HM as a top layer on the first metal plugs, forming a second patterned dielectric layer over the first conductive features and the first metal plugs. Therefore the second patterned dielectric layer having second openings to expose the first conductive feature and a subset of the first metal plugs and forming second metal plugs in the second openings to connect to connect the first conductive feature and the subset of the first metal plugs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    providing a device precursor, including:
        high-k/metal gates (HK/MGs) over a substrate;
        sidewall spacers along HK/MG sidewalls,
        conductive features over the substrate, wherein each of the conductive features has a top surface that is below a top surface of the HK/MGs, horizontally; and
        a first dielectric layer separating the HK/MGs and the conductive features;
    recessing the HK/MGs to form first trenches on the HK/MGs;
    forming first hard masks (HMs) in the first trenches, wherein the first HMs are top layers on the HK/MGs;
    forming a second dielectric layer over the HK/MGs and the conductive features, having first openings in the second and the first dielectric layers to expose the conductive features;
    forming first metal plugs in the first openings;
        forming second HMs as top layers on the first metal plugs, wherein the forming of the second HMs includes:
        recessing the first metal plugs to form second trenches;
        depositing a second HM layer over the substrate, including filling in the second trenches; and
        recessing the second HM layer until the first HMs are exposed;
    forming a third dielectric layer over the HK/MGs and the first metal plugs, having second openings in the third dielectric layer to expose a subset of the HK/MGs and the first metal plugs; and
    forming second metal plugs in the second openings to connect with the subset of HK/MGs and the first metal plugs.

2. The method of claim 1, wherein the conductive features include source and drain features.

3. The method of claim 1, wherein the forming of the first openings includes:
    forming a photoresist pattern over the second dielectric layer; and
    selectively etching the second and the first dielectric layers through the photoresist pattern, wherein the selective etch has selectivity with respect to the first hard mask.

4. The method of claim 3, wherein during the selective etch, the HK/MGs are protected by the first HMs and the sidewall spacers.

5. The method of claim 1, wherein the second dielectric layer is recessed by a chemical mechanical polishing (CMP).

6. The method of claim 1, wherein after recessing the second HM layer, the HK/MGs are covered by the first HMs and the first metal plugs are covered by the second HMs.

7. A method of circuit fabrication, the method comprising:
    receiving a substrate including:
        a source/drain feature;
        a first dielectric layer disposed on the substrate and on the source/drain feature;
        a high-k/metal gate disposed on the substrate and within the first dielectric layer; and
        a first hard mask disposed on the high-k/metal gate;
    forming a second dielectric layer on the first dielectric layer;
    patterning the first dielectric layer and the second dielectric layer to expose the source/drain feature;
    depositing a first conductive material within the patterned first dielectric to form a first plug electrically coupled to the source/drain feature;
    removing the second dielectric layer;
    recessing a portion of the first plug below a top surface of the first dielectric layer;

forming a second hard mask on the recessed first plug such that the second hard mask has a top surface substantially coplanar with the top surface of the first dielectric layer;

forming a third dielectric layer on the first dielectric layer, on the first hard mask, and on the second hard mask;

patterning the third dielectric layer, the first hard mask, and the second hard mask to expose the first plug and the high-k/metal gate, wherein the patterning of the third dielectric layer creates a recess in the second hard mask; and depositing a second conductive material within the patterned third dielectric layer and within the recess in the second hard mask to form a second plug electrically coupled to the first plug and a third plug electrically coupled to the high-k/metal gate.

8. The method of claim 7, wherein the patterning of the first dielectric layer and the second dielectric layer to expose the source/drain feature is performed using an etchant selected to avoid etching the first hard mask.

9. The method of claim 7 further comprising performing a chemical mechanical polishing (CMP) process after the depositing of the first conductive material.

10. A method of integrated circuit fabrication, the method comprising:
receiving a substrate, wherein the substrate includes:
a source/drain region of a transistor disposed within the substrate;
a device gate of the transistor disposed on the substrate and within a first dielectric layer;
a first hard mask layer disposed on the device gate;
patterning the first dielectric layer to form a first recess that exposes the source/drain region;
depositing a first conductive material and a second hard mask layer within the first recess such that the first conductive material defines a first plug electrically coupled to the source/drain region and such that the second hard mask layer has a topmost surface that is substantially coplanar with a topmost surface of the first dielectric layer;
recessing the first hard mask layer to expose the device gate;
recessing the second hard mask layer to expose the first plug; and
depositing a second conductive material within the recessed first hard mask layer and within the recessed second hard mask layer to form a second plug electrically coupled to the device gate and a third plug electrically coupled to first plug, respectively.

11. The method of claim 10, wherein the substrate further includes a third dielectric layer disposed on the first dielectric layer and directly above the device gate and the source/drain region, and
wherein the patterning of the first dielectric layer includes patterning the third dielectric layer to form the first recess.

12. The method of claim 11, wherein the patterning of the first dielectric layer to form the first recess is configured such that neither the first hard mask layer nor the device gate are exposed.

13. The method of claim 11 further comprising removing the third dielectric layer after depositing the first conductive material.

14. The method of claim 10, wherein the depositing of the first conductive material and the second hard mask layer includes:
planarizing the deposited first conductive material such that a topmost surface of the first conductive material is substantially coplanar with the topmost surface of the first dielectric layer;
thereafter recessing the deposited first conductive material;
depositing the second hard mask layer on the recessed first conductive material; and
planarizing the second hard mask layer such that the topmost surface of the second hard mask layer is substantially coplanar with the topmost surface of the first dielectric layer.

15. The method of claim 14, wherein the planarizing of the first conductive material includes performing a chemical mechanical polishing (CMP) process.

16. The method of claim 14, wherein the planarizing of the first conductive material exposes the first hard mask layer.

17. The method of claim 14, wherein the topmost surface of the recessed first conductive material is substantially coplanar with a topmost surface of the device gate.

18. The method of claim 10, wherein the device gate is a high-k metal gate.

19. The method of claim 10, wherein the patterning of the first dielectric layer to form the first recess uses an etchant selected to avoid etching the first hard mask layer.

20. The method of claim 10, wherein the device gate includes sidewall spacers disposed on exterior side surfaces of the device gate adjacent the first dielectric layer, and wherein a topmost surface of each of the sidewall spacers is substantially coplanar with the topmost surface of the first dielectric layer.

* * * * *